United States Patent
Watabe

(10) Patent No.: US 9,680,127 B2
(45) Date of Patent: Jun. 13, 2017

(54) DISPLAY DEVICE AND MANUFACTURING METHOD THEREOF

(71) Applicant: Japan Display Inc., Tokyo (JP)

(72) Inventor: Kazufumi Watabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/808,808

(22) Filed: Jul. 24, 2015

(65) Prior Publication Data
US 2016/0036003 A1   Feb. 4, 2016

(30) Foreign Application Priority Data
Jul. 30, 2014  (JP) .................. 2014-154880

(51) Int. Cl.
  *H01L 51/52*   (2006.01)
  *H01L 27/32*   (2006.01)
(52) U.S. Cl.
  CPC ...... *H01L 51/5253* (2013.01); *H01L 51/5246* (2013.01); *H01L 27/3244* (2013.01); *H01L 2251/5315* (2013.01); *H01L 2251/5338* (2013.01); *H01L 2251/5369* (2013.01)
(58) Field of Classification Search
  CPC ............. H01L 51/0545; H01L 51/0036; H01L 51/0541; H01L 51/0512
  See application file for complete search history.

(56) References Cited

U.S. PATENT DOCUMENTS

2003/0032210 A1   2/2003   Takayama et al.
2007/0224907 A1*  9/2007   Hayashi .............. H01L 51/5256
                                                      445/24
2010/0089636 A1   4/2010   Ramadas et al.
2016/0035999 A1*  2/2016   Ii ........................ H01L 51/5253
                                                      257/40

FOREIGN PATENT DOCUMENTS

| JP | 2003-195787 A | 7/2003 |
| JP | 2004-142351 A | 5/2004 |
| JP | 2010-511267 A | 4/2010 |
| JP | 2011-143550 A | 7/2011 |
| JP | 2012-096431 A | 5/2012 |

OTHER PUBLICATIONS

Japanese Office Action mailed May 9, 2017 for corresponding JP Patent Application No. 2014-154880, with English Translation.

* cited by examiner

*Primary Examiner* — Quoc Hoang
(74) *Attorney, Agent, or Firm* — Typha IP LLC

(57) ABSTRACT

In an organic EL display device, an improvement in the performance of a barrier film that blocks entry of a substance that causes degradation, such as moisture, into an organic electroluminescent element is achieved. The organic EL display device includes the barrier film, which is a stacked film including a barrier base material layer made of silicon oxide or silicon nitride and a base material coating layer in contact with an impregnated barrier base material layer. The barrier film blocks transmission of a substance that degrades the organic electroluminescent element. Nano-ink is applied on a surface of the barrier base material layer, and the barrier base material layer is impregnated with the nano-ink. The barrier base material layer subjected to the impregnation treatment serves as the impregnated barrier base material layer, while the nano-ink after impregnation serves as the base material coating layer.

11 Claims, 5 Drawing Sheets

DISPLAY DEVICE AND MANUFACTURING METHOD THEREOF

CROSS-REFERENCE TO RELATED APPLICATION

The present application claims priority from Japanese application JP2014-154880 filed on Jul. 30, 2014, the content of which is hereby incorporated by reference into this application.

BACKGROUND OF THE INVENTION

1. Field of the Invention

The present invention relates to a display device including an organic electroluminescent element and a manufacturing method thereof, and more particularly to a barrier film that blocks transmission of a substance degrading the organic electroluminescent element.

2. Description of the Related Art

A flat panel display such as an organic electroluminescent (EL) display device includes a display panel including thin film transistors (TFTs) or organic light-emitting diodes (OLEDs) as organic electroluminescent elements formed on a substrate. Heretofore, a glass substrate has been used for the substrate of the display panel. In recent years, however, a flexible display is being developed in which polyimide as a resin film is used for the material of the substrate so that the display panel can be bent.

A protective film that protects the OLED whose characteristics are degraded by moisture or the like is provided in the organic EL display device. For example, the organic EL display device has a structure in which an element substrate on which the OLEDs and the like are formed and a counter substrate on which color filters and the like are formed are bonded together with a filling resin layer interposed therebetween. A sealing film having a moisture-proof function to protect the OLEDs against moisture contained in the filling layer is formed on the OLEDs. Moreover, in order to prevent entry of moisture from a polyimide film serving as a base material of the element substrate, a barrier film with low moisture permeability is provided between the polyimide film and the OLEDs. As the barrier film, a silicon oxide film or silicon nitride film that is stacked by a chemical vapor deposition (CVD) method, or an organic film that is deposited by a vapor deposition method is used.

SUMMARY OF THE INVENTION

Polyimide can be thermally decomposed at about 500° C. or more, which restricts the upper limit temperature in forming the barrier film on the polyimide film, and thus there is a problem that the characteristics of the barrier film may be limited. For example, when silicon oxide or silicon nitride is formed by a CVD method under this temperature limitation, a reduced film thickness tends to result in a porous film, so that the barrier performance may be insufficient. On the other hand, an increased film thickness can improve the barrier performance, but a time required for deposition is lengthened, so that productivity is reduced. Moreover, the heat resistance of an organic material used for the barrier film is relatively low. Therefore, when the temperature of a low-temperature polysilicon (LTPS) process for forming TFT is higher than the heat-resistant temperature of an organic material, it is difficult to form the barrier film on the polyimide film from the organic material. Moreover, the barrier film has poor adhesion to an organic film such as polyimide, so that detachment of the film easily occurs.

The invention achieves an improvement in the performance of a barrier film that blocks entry of a substance that causes degradation, such as moisture, into an organic electroluminescent element.

(1) A display device according to an aspect of the invention includes: a base material made of a resin material; an organic electroluminescent element provided on the base material; and a barrier film including a first layer and a second layer, the first layer containing silicon oxide or silicon nitride, the second layer being in contact with the first layer, the first layer containing a material of the second layer.

(2) A manufacturing method of a display device according to another aspect of the invention includes the steps of: forming an insulating layer made of silicon oxide or silicon nitride; forming, by application, a nano-ink layer on a surface of the insulating layer; and impregnating the insulating layer with at least a portion of the nano-ink layer.

(3) A manufacturing method of a display device according to still another aspect of the invention includes the steps of: forming an insulating layer made of silicon oxide or silicon nitride; forming, by application, an organic material layer on a surface of the insulating layer; and impregnating the insulating layer with at least a portion of the organic material layer.

DETAILED DESCRIPTION OF THE INVENTION

Figure 1:
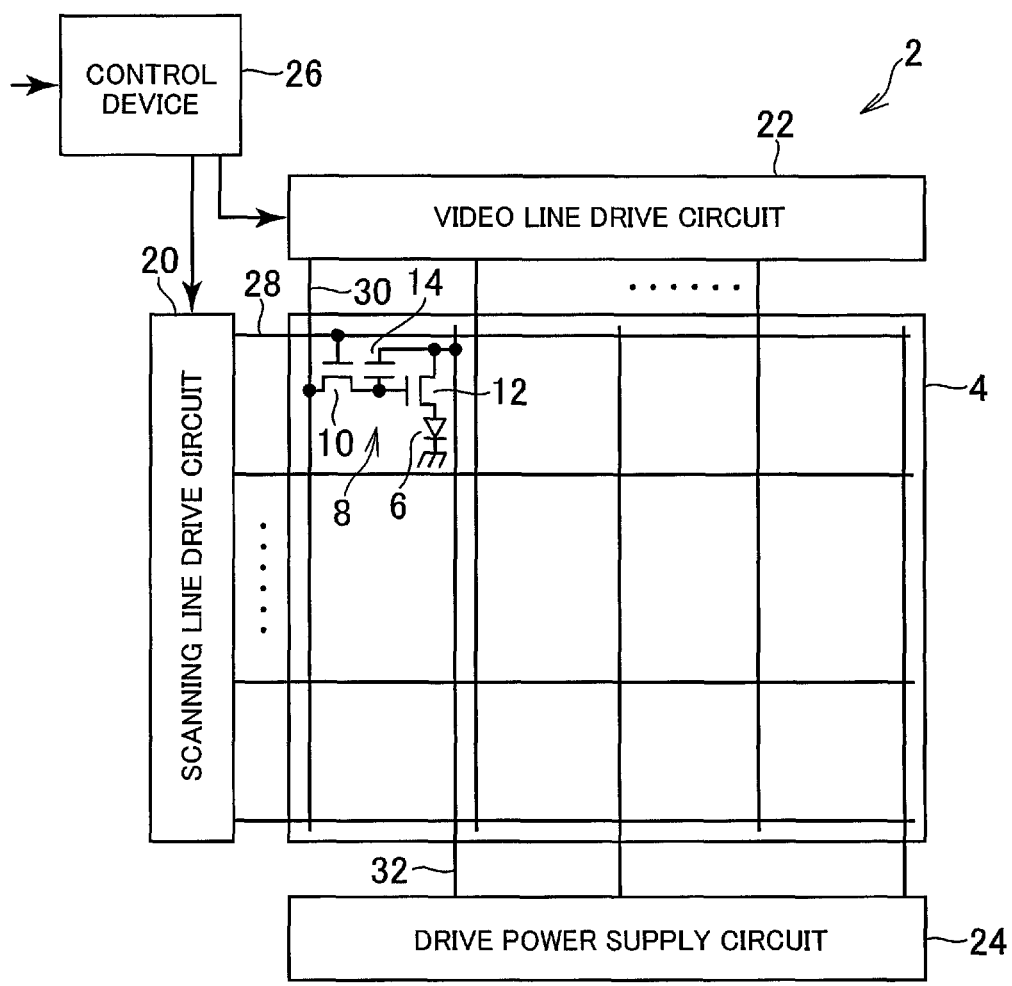
FIG. 1 is a schematic view showing a schematic configuration of an organic EL display device according to a first embodiment of the invention.

Hereinafter, embodiments of the invention will be described based on the drawings.

The disclosure is illustrative only. Appropriate modifications that will readily occur to those skilled in the art and fall within the gist of the invention are of course included in the scope of the invention. In the drawings, the width, thickness, shape, and the like of each part may be schematically represented, compared to those in practicing aspects of the invention, for more clarity of description. However, they are illustrative only, and do not limit the interpretation of the invention. Moreover, in the specification and the drawings, elements similar to those described in relation to a previous drawing are denoted by the same reference numerals and signs, and a detailed description may be appropriately omitted.

First Embodiment

An organic EL display device is an active matrix display device, which is mounted as a display panel on a television set, a personal computer, a portable terminal, a mobile phone, or the like. FIG. 1 is a schematic view showing a schematic configuration of an organic EL display device 2 according to a first embodiment. The organic EL display device 2 includes a pixel array portion 4 that displays an image and a drive portion that drives the pixel array portion. The organic EL display device 2 is a flexible display, in which a resin film having flexibility, not a glass substrate, is used as a base material and a stacked structure of TFTs, OLEDs, and the like is formed on the base material.

In the pixel array portion 4, OLEDs 6 and pixel circuits 8 are disposed in a matrix corresponding to pixels. The pixel circuit 8 includes a plurality of TFTs 10 and 12 and a capacitor 14.

On the other hand, the drive portion includes a scanning line drive circuit 20, a video line drive circuit 22, a drive power supply circuit 24, and a control device 26, and drives the pixel circuit 8 to control light emission of the OLED 6.

The scanning line drive circuit 20 is connected to scanning signal lines 28 each provided for alignment of pixels in the horizontal direction (pixel row). The scanning line drive circuit 20 sequentially selects the scanning signal lines 28 in response to a timing signal input from the control device 26, and applies to the selected scanning signal line 28 a voltage to turn on the lighting TFT 10.

The video line drive circuit 22 is connected to video signal lines 30 each provided for alignment of pixels in the vertical direction (pixel column). The video line drive circuit 22 receives a video signal from the control device 26, and outputs, in synchronizing with selection of the scanning signal line 28 performed by the scanning line drive circuit 20, a voltage in response to the video signal of the selected pixel row to each of the video signal lines 30. The voltage is written via the lighting TFT 10 to the capacitor 14 in the selected pixel row. The drive TFT 12 supplies a current in response to the written voltage to the OLED 6, whereby the OLED 6 of the pixel corresponding to the selected scanning signal line 28 emits light.

The drive power supply circuit 24 is connected to drive power lines 32 each provided in the pixel column, and supplies a current to the OLED 6 via the drive power line 32 and the drive TFT 12 of the selected pixel row.

An anode of the OLED 6 is connected to the drive TFT 12. On the other hand, a cathode of the OLEDs 6 is basically connected to a ground potential. The cathode of the OLEDs 6 of all pixels is composed of a common electrode.

Figure 2:
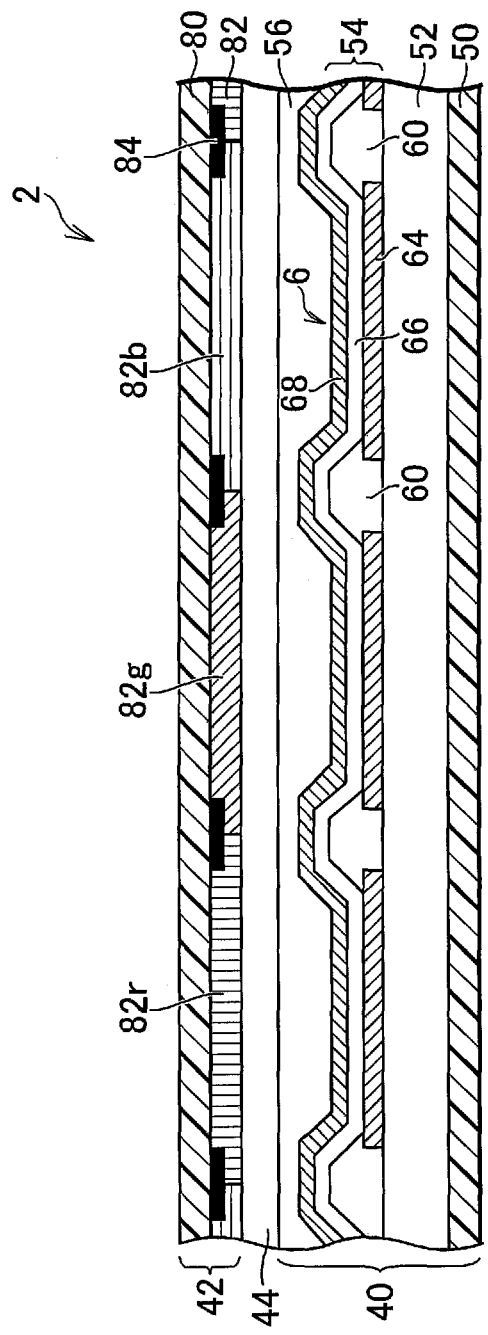
FIG. 2 is a schematic partial cross-sectional view of a pixel array portion of the organic EL display device according to the first embodiment of the invention.

FIG. 2 is a schematic partial cross-sectional view of the pixel array portion 4 of the organic EL display device 2, showing a cross-section along the horizontal direction of a display area. The organic EL display device 2 has a structure in which an OLED substrate 40 and a counter substrate 42 are bonded together with a filling material 44 interposed therebetween. In the embodiment, the pixel array portion is of a top emission-type, in which the OLEDs 6 serving as light-emitting portions are formed on the OLED substrate 40 and light generated by the OLED is emitted through the counter substrate 42. That is, the light of the OLED is emitted upward in FIG. 2. Moreover, a method for providing color display in the organic EL display device 2 shown in FIG. 2 is a color filter method, in which white light is generated in the OLEDs and RGB colors are obtained by transmitting the white light through color filters.

The OLED substrate 40 has a structure in which a circuit portion 52, an OLED portion 54, a sealing layer 56, and the like are stacked on a base material 50 (panel base material) formed of a resin film. For example, a polyimide film can be used as the base material 50.

The circuit portion 52 includes the pixel circuit 8, the scanning signal line 28, the video signal line 30, and the drive power line 32, all described above. Moreover, at least portions of the drive circuits 20 and 22, the drive power supply circuit 24, and the control device 26 can be configured as the circuit portion 52 on the OLED substrate 40 integrally with the pixel array portion. Although a detailed cross-sectional structure of the circuit portion 52 is not shown in FIG. 2, the cross-sectional structure will be described later with reference to FIGS. 3A to 3E and FIGS. 4A to 4D.

The OLED portion 54 includes the OLEDs 6 each formed for each pixel and a bank 60 formed at pixel boundaries. The OLED 6 includes a lower electrode 64, an organic layer 66, and an upper electrode 68 stacked in this order. The organic layer 66 is configured to include a hole transport layer, a light-emitting layer, and an electron transport layer.

The lower electrode 64 and the upper electrode 68 constitute the anode and cathode of the OLED 6, respectively. Light emission in the light-emitting layer is controlled by an electric signal applied between the anode and the cathode. As described above, the upper electrode 68 is basically formed common to the pixels in the entire display area, and a common voltage is applied from the drive portion to the upper electrode 68. The lower electrode 64 (pixel electrode) is formed for each of the pixels, and supplied with a current in response to a video signal through the drive portion and the pixel circuit 8.

The bank 60 is formed of an insulating layer between pixels, and electrically isolates the lower electrodes 64 from each other. The sealing layer 56 is stacked on the OLED portion 54. The sealing layer 56 has a function of blocking transmission of moisture or the like contained in the filling material 44 and protecting the OLED.

The counter substrate 42 is, for example, a stacked body in which a color filter 82 and the like are stacked on a transparent base material 80 formed of a resin film. For example, a polyimide film can be used as the base material 80 similarly to the base material 50. In the white light generated by the OLED, the color filter 82 selectively transmits light of a component corresponding to the color of a pixel. As the color filter 82, for example, a color filter 82*r* that transmits a red wavelength band is disposed corresponding to an R pixel; a color filter 82*g* that transmits a green wavelength band is disposed corresponding to a G pixel; and a color filter 82*b* that transmits a blue wavelength band is disposed corresponding to a B pixel. A black matrix 84 is disposed at boundaries between the color filters 82*r*, 82*g*, and 82*b*.

The OLED substrate 40 and the counter substrate 42 are bonded together with the filling material 44 interposed therebetween such that the sealing layer 56 and the color filter 82 face each other. Specifically, the OLED substrate 40 and the counter substrate 42 are disposed to face each other with a gap provided therebetween, and a dam material (sealing material) (not shown) made of a resin is disposed in the gap so as to surround the display area, so that the gap in the display area is hermetically sealed. The filling material 44 made of a transparent resin fills the gap inside the dam material. Thereafter, the dam material and the filling material 44 are cured to bond the substrates together.

FIGS. 3A to 3E and FIGS. 4A to 4D are schematic process flow views of steps for forming the stacked structure of the circuit portion 52 in the OLED substrate 40, showing partial cross-sectional views of the OLED substrate 40 in main steps. Hereinafter, steps up to the formation of the lower electrode 64 will be described with reference to FIGS. 3A to 3E and FIGS. 4A to 4D.

Figure 3A:
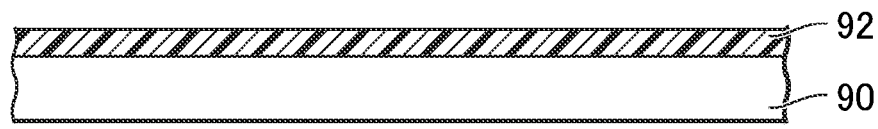
FIGS. 3A to 3E are schematic process flow views of steps for forming a stacked structure of a circuit portion in an OLED substrate of the organic EL display device according to the first embodiment of the invention.

Since a resin film used as the base material 50 has flexibility, a glass substrate 90 is used as a support to maintain the base material 50 flat insteps for manufacturing the organic EL display device 2. For example, a polyimide film 92 to be the base material 50 is formed by applying a raw material solution on a surface of the glass substrate 90 by spin coating, and imidizing the applied raw material solution by a heat treatment (FIG. 3A).

On a surface of the polyimide film 92, a barrier film 94 is formed as an under film of a polysilicon (p-Si) layer described later (FIGS. 3B to 3E and FIG. 4A). The barrier film 94 is located between the polyimide film 92 and the OLED 6, and blocks transmission of a substance that degrades the OLED 6, such as moisture entering from the surface of the polyimide film 92, after the glass substrate 90 is stripped.

Figure 3B:
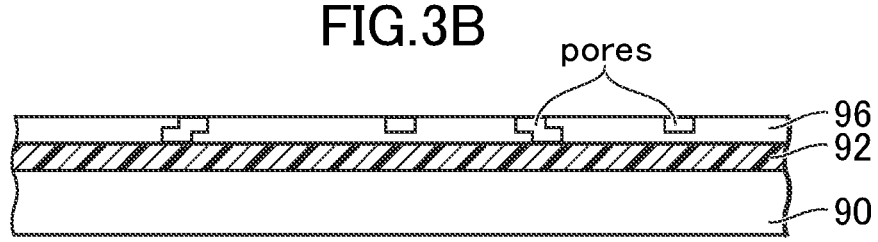

In the embodiment, a barrier base material layer 96 is first stacked as the barrier film 94 on the surface of the polyimide film 92 (FIG. 3B). The barrier base material layer 96 is, for example, silicon oxide ($SiO_x$) and deposited by a CVD method.

Figure 3C:
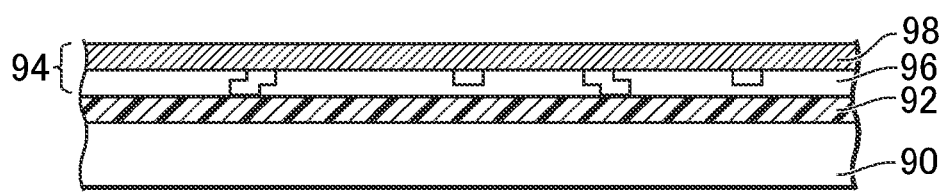

On a surface of the barrier base material layer 96, nano-ink 98 containing aluminum (Al) or silver (Ag) nanoparticles is applied (FIG. 3C). For example, the nano-ink 98 is applied by a spin-coating method, and subjected to drying under reduced pressure or the like after application so that the nano-ink 98 is less likely to flow.

Figure 3D:
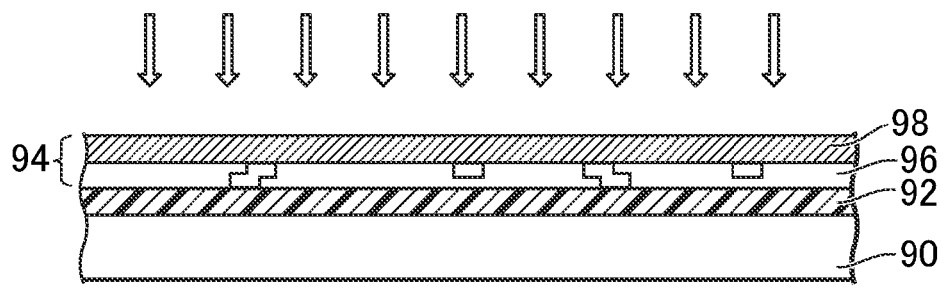
Figure 3E:
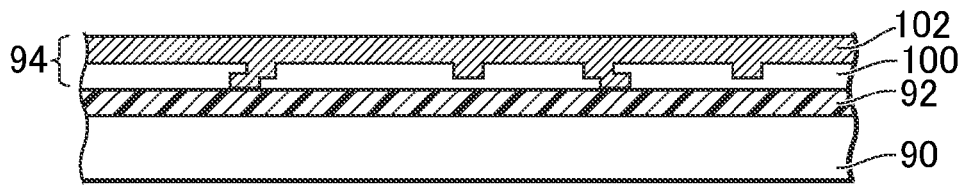

Thereafter, a heat treatment is applied to a surface of the OLED substrate 40 on which the nano-ink 98 is applied, to fuse and bake the nano-ink layer (FIG. 3D). Due to this, a base material coating layer 102 that covers the surface of the barrier base material layer 96 is formed, and at the same time, the barrier base material layer 96 can be impregnated with at least a portion of the nano-ink layer, so that an impregnated barrier base material layer 100 as a barrier base material layer that has been subjected to impregnation is formed under the base material coating layer 102 (FIG. 3E). In the barrier base material layer 96, voids of material particles, or a defect due to a foreign substance or the like that may exist on a deposited surface may exist. In contrast to this, since the voids or the like are closed by nanoparticles in the impregnated barrier base material layer 100, the impregnated barrier base material layer 100 is less likely to transmit a substance that degrades the OLED 6.

For example, the fusing and baking of the nano-ink 98 can be carried out by a flash lamp anneal (FLA) treatment. In the FLA treatment, for example, the temperature of an irradiated surface is increased by light irradiation for a short time, about one millisecond. In that case, a large temperature gradient is generated from the irradiated surface with respect to the depth direction. That is, since temperature rise in the lower layer can be suppressed while the nano-ink 98 is sufficiently heated, the thermal degradation of the polyimide film 92, for example, can be avoided.

Moreover, the metal contained in the nano-ink 98 may be oxidized by baking in an oxygen atmosphere. Due to this, the binding of $SiO_x$ constituting the barrier base material to the metal with which the impregnated barrier base material layer 100 is impregnated may be strengthened in the impregnated barrier base material layer 100. Further, when, for example, the barrier base material layer is impregnated with Al, aluminum oxide having higher strength is formed by oxidization, and thus the strength of the impregnated barrier base material layer 100 is increased. It is desirable during the treatment in the oxygen atmosphere that the main body of the polyimide film 92 is not damaged. Accordingly, it would be better to stop the oxidation treatment when the oxidation reaches the vicinity of the interface of the polyimide film 92.

Figure 4A:
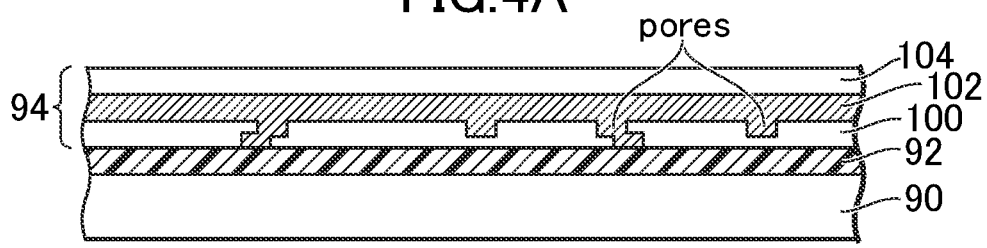
FIGS. 4A to 4D are schematic process flow views of steps for forming the stacked structure of the circuit portion in the OLED substrate of the organic EL display device according to the first embodiment of the invention.

As described above, even when thin $SiO_x$ is used as the barrier base material layer 96, barrier performance is improved through impregnation, and therefore, the barrier film 94 can basically adopt a structure composed only of the impregnated barrier base material layer 100 and the base material coating layer 102. However, in the barrier film 94 of the embodiment, an additional barrier layer 104 made of silicon nitride ($SiN_y$) is further stacked on a surface of the base material coating layer 102, so that the barrier performance is further enhanced (FIG. 4A). For example, $SiN_y$ for forming the additional barrier layer 104 is deposited by a CVD method. In this case, when alkali metal ions such as sodium (Na) contained in the glass substrate 90 are diffused into p-Si constituting the channel of a TFT, the characteristics of the TFT are degraded. Even when an alkali-free glass substrate is used for the glass substrate 90, a small amount of alkali metal ions may exist in the alkali-free glass substrate. The $SiN_y$ film constituting the additional barrier layer 104 prevents the alkali metal ions from diffusing from the glass substrate 90 into the p-Si layer.

Figure 4B:
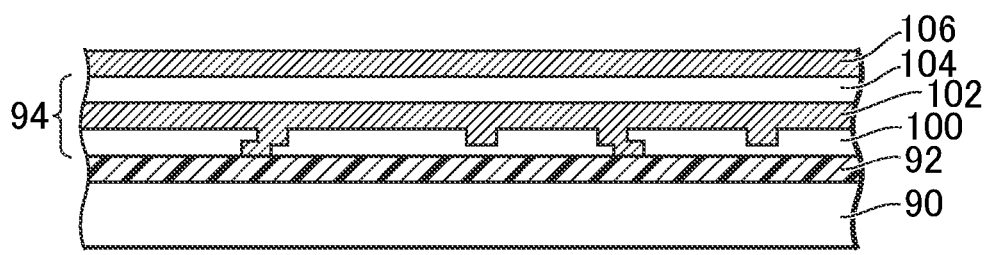

On a surface of the under film including the barrier film 94 described above, an amorphous silicon (a-Si) film 106 is formed by, for example, a CVD method (FIG. 4B). Although the a-Si film 106 is stacked on a surface of the $SiN_y$ film constituting the additional barrier layer 104 in FIG. 4B, a $SiO_x$ film may be further stacked as an under film on the additional barrier layer 104, and the a-Si film 106 may be stacked on a surface of the $SiO_x$ film. The $SiO_x$ film may improve the characteristics of the interface relative to p-Si.

Figure 4C:
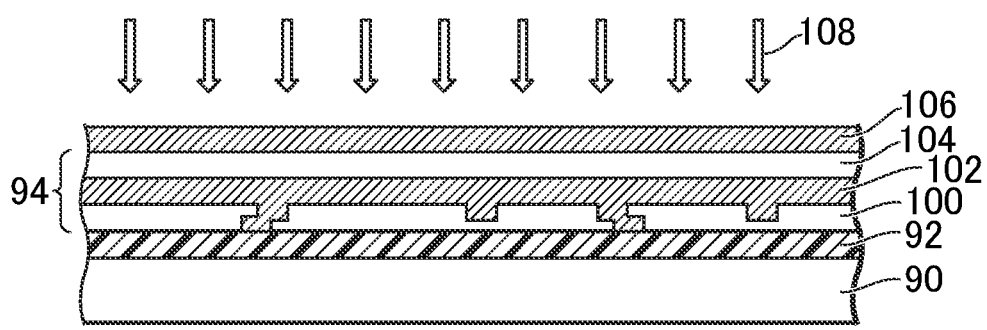
Figure 4D:
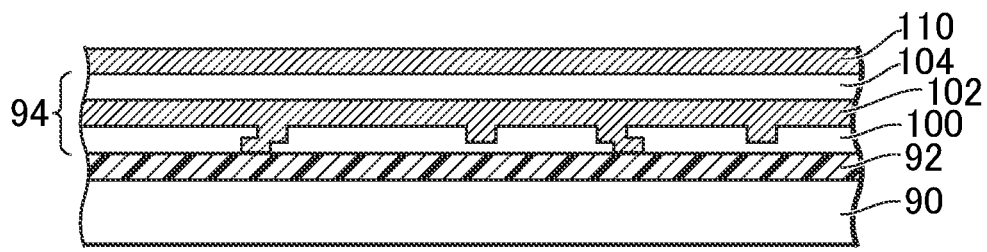

The a-Si film 106 is processed by LTPS annealing (FIG. 4C). Specifically, fusing and crystallization of the a-Si film 106 are carried out by irradiation with excimer laser light 108, so that a p-Si film 110 is formed (FIG. 4D).

Subsequently, the p-Si film 110 is patterned using a photolithography technique, so that the p-Si film 110 at places to be used in the circuit portion 52 is selectively left. For example, a top gate-type TFT is formed using the p-Si film 110. Specifically, a semiconductor region serving as the channel portion, source portion, and drain portion of the TFT is formed of the p-Si film 110. A gate electrode is disposed on the channel portion of the TFT via a gate insulating film. The gate electrode is formed by patterning a metal film formed by sputtering or the like. Moreover, an impurity is introduced by ion implantation into the p-Si serving as the source portion and drain portion of the TFT, and further, a source electrode and a drain electrode that are electrically connected to the source portion and the drain portion are formed. Wires such as the scanning signal line 28, the video signal line 30, and the drive power line 32 shown in FIG. 1 are formed using metal layers or the like forming the gate electrode, the source electrode, and the drain electrode.

After the formation of the source electrode, the drain electrode, and the like, an inter-layer insulating film is stacked by, for example, a CVD method. The stacked structure from the barrier base material layer 96 to the inter-layer insulating film corresponds to the circuit portion 52 shown in FIG. 2.

A conductor film is formed on a surface of the circuit portion 52, that is, on the inter-layer insulating film, and the lower electrode 64 is formed by patterning the conductor film. If the drive TFT 12 shown in FIG. 1 is an n-channel TFT, the lower electrode 64 is electrically connected to the source electrode of the drive TFT 12 via a contact hole formed in the inter-layer insulating film.

The lower electrode 64 can be formed of, for example, a transparent electrode material such as indium tin oxide (ITO). An ITO film can be deposited by a reactive sputtering method using a mixed gas of $Ar+O_2$. Moreover, the lower electrode 64 can also be formed using another transparent electrode material, for example, indium zinc oxide (IZO), tin oxide, zinc oxide, indium oxide, or an aluminum oxide composite oxide.

The organic EL display device 2 of the embodiment is of a top emission-type as described above, and the lower electrode 64 can adopt a two-layered structure in which a transparent conductive film is stacked on a reflective layer formed of a material having a high optical reflectance. For example, the reflective layer can be formed of Al, Ag, or the like, and reflects light from the light-emitting layer toward a display surface, that is, the counter substrate 42 side.

As shown in FIG. 2, after the formation of the lower electrode 64, a photosensitive acrylic resin, for example, is applied on the lower electrode 64 and patterned by a photolithography technique to form the bank 60 at the pixel boundaries. The lower electrode 64 is exposed in a pixel effective area surrounded by the bank 60. After the formation of the bank 60, the layers constituting the organic layer 66 are sequentially stacked on the lower electrode 64. The upper electrode 68 is formed on the organic layer 66 using a transparent electrode material. For example, IZO is deposited as the upper electrode 68 by a reactive sputtering method using a mixed gas of $Ar+O_2$. Then, for example, a $SiN_y$ film is deposited as the sealing layer 56 by a CVD method.

The OLED substrate 40 is manufactured in this manner. As previously described, the pixel array portion 4 is produced by bonding the OLED substrate 40 and the counter substrate 42 together. After the OLED substrate 40 and the counter substrate 42 are bonded together, the glass substrate 90 is stripped.

In the organic EL display device 2 as described above, the barrier film 94 including the impregnated barrier base material layer 100 is formed between the base material 50 and the OLED 6 of the OLED substrate 40. As previously described, since the pores (pinholes) that may exist in the barrier base material layer 96 are closed by the nanoparticles filling therein in the impregnated barrier base material layer 100, the impregnated barrier base material layer 100 is less likely to transmit a substance that degrades the OLED 6. With this improved resistance to transmission due to the impregnation of the nano-ink 98 or the filling of nanoparticles, it is not necessary to increase the thickness of the barrier base material layer 96 in order to obtain the resistance to transmission. That is, the impregnated barrier base material layer 100 can be formed to be relatively thin. The reduced film thickness contributes to a reduction in process load; while the impregnation of the film with the nano-ink 98 can not only improve a barrier property but also provide a sufficient bending strength even with the reduced film thickness. Further, since the pores (pinholes) of the barrier base material layer 96 are filled, the uniformity of stress in a plane of the impregnated barrier base material layer 100 is improved. Therefore, a change, such as the occurrence of a defect in the impregnated barrier base material layer 100 due to a temperature change, is less likely to occur in a subsequent manufacturing process, so that productivity is improved. At the same time, with the improved uniformity of stress, the occurrence of warpage can be suppressed upon handling a large-sized substrate.

In the embodiment described above, the barrier base material layer 96 made of $SiO_x$ is stacked on the polyimide film 92. Since a $SiO_x$ film has flexibility compared to a $SiN_y$ film, the impregnated barrier base material layer 100 using $SiO_x$ functions as a stress buffer layer between the polyimide film 92 and the layer on the impregnated barrier base material layer 100, which is preferable in terms of constituting a flexible display.

On the other hand, the barrier film 94 may be formed using the impregnated barrier base material layer 100 that is obtained from the barrier base material layer 96 made of $SiN_y$. Moreover, the additional barrier layer 104 may be a $SiO_x$ film instead of a $SiN_y$ film. Moreover, the additional barrier layer 104 may be located under the impregnated barrier base material layer 100. Moreover, the barrier film 94 can adopt a structure not including the additional barrier layer 104 as described above. In the embodiment described above, however, since the p-Si film 110 is formed on the barrier film 94, a base suitable for the growth of the p-Si film 110 is needed under the p-Si film 110. Moreover, when the base material coating layer 102 has conductivity, for example, when the base material coating layer 102 is made of Al or Ag applied as nano-ink, or silver oxide obtained by subjecting the Ag to an oxidation treatment, consideration such as providing an insulating film on the base material coating layer 102 is given so that the base material coating layer 102 does not contact the conductive member of the circuit portion 52, such as the p-Si film 110. An oxide of aluminum is an insulator, and therefore, consideration is not especially needed in this point of view.

For the nano-ink 98, those containing carbon as nanoparticles can be used. Moreover, the barrier base material layer 96 may be impregnated with an organic material such as an acrylic resin, instead of the nano-ink 98, to form the impregnated barrier base material layer 100. For example, a thermoplastic resin can be used as the organic material, and the barrier base material layer 96 can be impregnated with the resin that has been thermally fused. The organic material may be, for example, a material that is polymerized and cured by ultraviolet irradiation or the like, such as a synthetic resin, a monomer, or an oligomer. In this case, the material melted by heat or dissolved by a solvent is subjected to an impregnation treatment, and then, a polymerization treatment is carried out.

The barrier film 94 described above includes the base material coating layer 102 in contact with the barrier base material layer 96 containing $SiO_x$ or $SiN_y$, and the material of the base material coating layer 102 is contained in the barrier base material layer 96. Here, the barrier film 94 can adopt a structure in which the nano-ink 98 or an organic material deposited on the barrier base material layer 96 does not necessarily form the base material coating layer 102 on the surface of the impregnated barrier base material layer 100 after the impregnation treatment. That is, the nano-ink 98 or the organic material completely penetrates into the impregnated barrier base material layer 100, so that an area where the nano-ink 98 or the organic material is not left may exist on the surface of the impregnated barrier base material layer 100.

The TFT is of a top gate-type in the embodiment, but the TFT may have another structure. For example, the TFT may be of a bottom gate-type.

Second Embodiment

The barrier film including the impregnated barrier base material layer described in the first embodiment can be provided at a position at which the barrier film is integrated with the sealing layer 56 (sealing film) of the organic EL display device 2. Specifically, the barrier film can be provided at a position in contact with an upper or lower surface of the sealing layer 56 separately from the sealing layer 56, and in addition, the sealing layer 56 itself can be configured as the barrier film. Similarly to the sealing layer 56, the barrier film favorably blocks transmission of moisture or the like contained in the filling material 44, and protects the OLEDs.

In a second embodiment, an organic EL display device 2 in which a sealing layer 56 itself is configured as a barrier film including an impregnated barrier base material layer will be described. The organic EL display device 2 of the embodiment has a structure substantially common with that of the organic EL display device 2 of the first embodiment described above, so that FIG. 1 and FIG. 2 can be referred to for the schematic structure of the organic EL display device 2 of the second embodiment. Hereinafter, the organic EL display device 2 according to the second embodiment will be described mainly on differences from the first embodiment; while components similar to those of the organic EL display device 2 of the first embodiment are denoted by the same reference numerals and signs, and the description thereof is basically omitted.

Figure 5A:
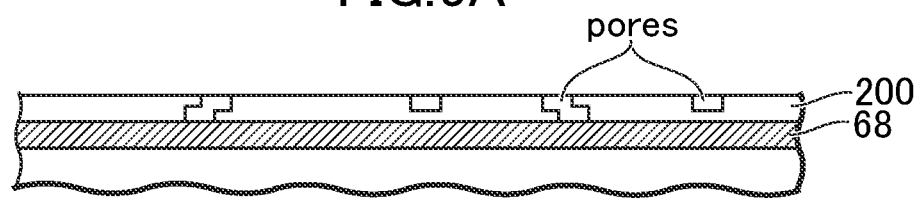
FIGS. 5A to 5C are schematic process flow views of steps for forming a sealing layer in an OLED substrate of an organic EL display device according to a second embodiment of the invention.
Figure 5B:
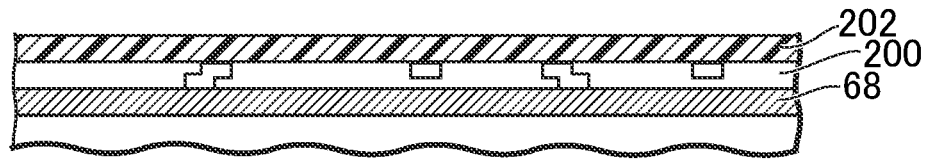
Figure 5C:
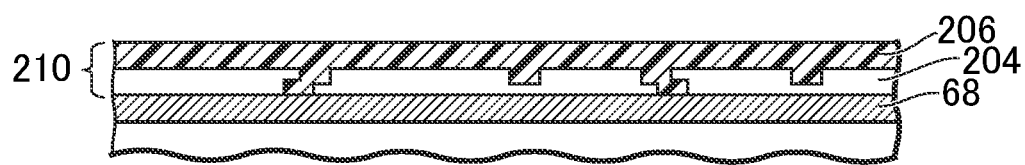

FIGS. 5A to 5C are schematic process flow views of steps for forming the sealing layer 56 in an OLED substrate 40, showing partial cross-sectional views of the OLED substrate 40 in main steps.

On a surface of an upper electrode 68, a $SiN_y$ film is deposited as a barrier base material layer 200 by, for example, a CVD method (FIG. 5A).

On a surface of the barrier base material layer 200, an organic material film 202 is formed (FIG. 5B). The organic material film 202 is made of, for example, a UV-curable acrylic resin and formed by deposition by a vapor deposition method, or by applying an acrylic resin dissolved in an organic solvent by a spin-coating method.

Thereafter, a heat treatment is applied to a surface of the OLED substrate 40 on which the organic material film 202 is formed, to fuse the acrylic resin, so that the barrier base material layer 200 is impregnated with at least a portion of the acrylic resin. Due to this, an impregnated barrier base material layer 204 as the barrier base material layer 200 impregnated with the acrylic resin and a base material coating layer 206 as the acrylic resin left on a surface of the impregnated barrier base material layer 204 are formed. After the impregnation treatment, ultraviolet irradiation (UV irradiation) is carried out to cure the base material coating layer 206 and the acrylic resin in the impregnated barrier base material layer 204. Due to this, a barrier film 210 including the impregnated barrier base material layer 204 and the base material coating layer 206 is formed as the sealing layer 56 (FIG. 5C).

A $SiN_y$ film basically has high resistance to transmission of moisture or the like compared to a $SiO_x$ film. However, holes may be formed when the film thickness of the $SiN_y$ film is thin, and also, a defect may occur due to a foreign substance or the like that may exist on a deposited surface. In contrast to this, since the holes or the like are closed by the organic material filling therein in the impregnated barrier base material layer 204, the impregnated barrier base material layer 204 is less likely to transmit a substance that degrades the OLED 6.

For example, the thermal fusion of the organic material film 202 can be carried out by the FLA treatment. For example, when the organic material film 202 is deposited by a vapor deposition apparatus, the apparatus can adopt a structure in which a deposition chamber includes a transparent window made of silica glass or the like and the organic material film 202 can be irradiated with light from the outside of the window. The FLA treatment and the UV irradiation treatment are carried out through the window. Incidentally, in the FLA treatment of the embodiment, ultraviolet light is removed through a filter to prevent polymerization. In this apparatus, the formation, FLA treatment, and UV irradiation treatment of the organic material film 202 can be carried out without taking the OLED substrate 40 out of the deposition chamber (vacuum treatment chamber), so that preferred productivity can be realized. Further, by configuring the apparatus such that another CVD step before or after the deposition of the organic material film 202, for example, the formation of the barrier base material layer 200 is carried out in the same deposition chamber, or in another deposition chamber connected to the above-mentioned deposition chamber without breaking the vacuum, an improvement in productivity can be further achieved.

The organic material film 202 can be formed of a non-UV-curable material, and also can be formed of a material other than an acrylic resin. Since the pixel array portion 4 is of a top emission-type in the embodiment, the sealing layer 56 needs to transmit light. Accordingly, the material is selected so that the impregnated barrier base material layer 204 and the base material coating layer 206 become transparent.

For example, the organic material film 202 can be made of a fluorine resin such as perfluoro alkoxy alkane (PFA) or ethylene-tetrafluoroethylene copolymer (ETFE). Moreover, the organic material film 202 may be formed of a monomer or an oligomer, which is subjected to an impregnation treatment and then polymerized to form a synthetic resin such as an acrylic resin. Moreover, the impregnated barrier base material layer 204 may be formed by impregnating the barrier base material layer 200 with nano-ink instead of the organic material film 202. For example, since aluminum oxide has a broad transmission wavelength region from the ultraviolet region to the infrared, the barrier film 210, which is transparent, can be formed such that Al nano-ink is applied on the barrier base material layer and subjected to fusion, impregnation, and oxidation by the FLA treatment or the like.

Moreover, the barrier film 210 may be formed using, as the barrier base material layer 200, another inorganic material film such as a $SiO_x$ film. Further, the barrier film 210 can be configured to include, in addition to the impregnated barrier base material layer 204 using a $SiO_x$ film, an additional barrier layer formed of a $SiN_y$ film stacked on a surface of the base material coating layer 206.

Modified Examples

The barrier film including the impregnated barrier base material layer described in the embodiments can be provided at a position other than the positions shown in the first and second embodiments.

For example, the barrier film can be provided on a filling-material-side surface of the counter substrate 42 to be bonded on the sealing layer 56 via the filling material 44.

Moreover, when, for the purpose of protecting a surface of the base material 80 for example, a film using polyethylene terephthalate (PET) as a base material and subjected to, for example, a hard coating treatment is attached to the surface, the film can be a film with the barrier film formed on a rear surface thereof.

The barrier films described in the embodiments and modified examples can be used together.

In the embodiments, the organic EL display device has been illustrated as an example of the disclosure. However, the barrier film can be adopted, for preventing the degradation of a structure due to permeation of moisture or the like, also in other display devices such as a liquid crystal display device, another self-luminous-type display device, and an electronic paper-type display device including an electrophoretic element or the like. Moreover, it is needless to say that the display device is applicable, without particular limitation, to from middle- and small-sized display devices to a large-sized display device.

Various altered and modified examples within the range of the idea of the invention will occur to those skilled in the art, and it is understood that the altered and modified examples also belong to the scope of the invention. For example, when those skilled in the art appropriately add or remove a component or change the design of a component in the embodiments described above, or add or omit a step or change the conditions of a step in the embodiments described above, those are included in the scope of the invention as long as they include the gist of the invention.

Moreover, it is understood that as to other operational effects brought about by the aspects described in the embodiments, an operational effect that is apparent from the description of the specification or that will appropriately occur to those skilled in the art is of course brought about by the invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a base material made of a resin material;
   an organic electroluminescent element provided on the base material; and
   a barrier film including a first layer and a second layer, the first layer containing silicon oxide or silicon nitride, the second layer being in contact with a surface of the first layer,
   wherein the surface has pores, and
   the pores are filled with a part of the second layer.

2. The display device according to claim 1, wherein the first layer is impregnated with the part of the second layer.

3. The display device according to claim 2, wherein each of the pores is a void of particles made of the silicon oxide or the silicon nitride.

4. The display device according to claim 2, wherein each of the pores is a defect existing in the first layer.

5. The display device according to claim 2, wherein the part of the second layer is a nanoparticle.

6. The display device according to claim 2, wherein the part of the second layer contains, as a main component, any one of aluminum, silver, an acrylic resin, a fluorine resin, and carbon.

7. The display device according to claim 1, wherein the barrier film is located on and in physical contact with the base material.

8. The display device according to claim 1, further comprising, between the base material and the organic electroluminescent element, a circuit portion including a thin film transistor, wherein
   the barrier film is located between the base material and the circuit portion.

9. The display device according to claim 1, wherein
   the organic electroluminescent element includes a lower electrode, a light-emitting layer, and an upper electrode, and
   the barrier film is located on a side of the organic electroluminescent element opposite to the base material and is in contact with the upper electrode.

10. The display device according to claim 1, further comprising a counter base material facing the base material, wherein
    a filling material is disposed between the base material and the counter base material, and
    the barrier film is located between the counter base material and the filling material.

11. The display device according to claim 1, wherein
    the barrier film includes a third layer containing silicon oxide or silicon nitride on a side of the second layer opposite to the first layer.

* * * * *